United States Patent
Davlin et al.

(10) Patent No.: US 6,806,209 B2
(45) Date of Patent: Oct. 19, 2004

(54) DEVELOP PROCESSING METHOD OF A RESIST SURFACE ON A SUBSTRATE FOR REDUCED PROCESSING TIME AND REDUCED DEFECT DENSITY

(75) Inventors: John T. Davlin, Nampa, ID (US); Greg Montanino, Mountain Home, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/427,178

(22) Filed: May 1, 2003

(65) Prior Publication Data

US 2003/0203651 A1 Oct. 30, 2003

Related U.S. Application Data

(62) Division of application No. 09/945,565, filed on Aug. 30, 2001, now Pat. No. 6,559,072.

(51) Int. Cl.$^7$ .............................................. H01L 21/31
(52) U.S. Cl. .................... 438/782; 438/748; 430/329
(58) Field of Search ................................ 438/748, 758, 438/780, 782; 430/329; 396/611

(56) References Cited

U.S. PATENT DOCUMENTS

| | | | |
|---|---|---|---|
| 4,144,066 A | * 3/1979 | Ernsberger | 430/321 |
| 5,689,749 A | 11/1997 | Tanaka et al. | 396/611 |
| 5,960,225 A | 9/1999 | Fujimoto | 396/611 |
| 5,985,363 A | * 11/1999 | Shiau et al. | 427/240 |
| 6,089,762 A | 7/2000 | Mimasaka et al. | 396/611 |
| 6,159,646 A | 12/2000 | Jeon et al. | 430/30 |
| 6,352,818 B1 | 3/2002 | Hsieh | 430/322 |
| 6,471,421 B2 | 10/2002 | Kitamura | 396/604 |
| 6,548,228 B2 | * 4/2003 | Mutoh | 430/325 |
| 2001/0018166 A1 | 8/2001 | Fijino et al. | 430/311 |
| 2001/0033889 A1 | 10/2001 | Bhatt et al. | 427/1 |
| 2002/0001781 A1 | 1/2002 | Ema et al. | 430/329 |
| 2002/0115022 A1 | 8/2002 | Messick et al. | 430/311 |

* cited by examiner

Primary Examiner—Carl Whitehead, Jr.
Assistant Examiner—Stephen W. Smoot
(74) Attorney, Agent, or Firm—Schwegman, Lundberg, Woessner & Kluth, P.A.

(57) ABSTRACT

A develop process for reduced cycle time and reduced defects in the develop process for semiconductor/IC fabrication is shown. The use of a linear slit scan nozzle provides even distribution of a layer of develop material within an acceptable thickness and uniformity range such that a pre-wet step is not needed to spread the develop material evenly over the surface of a wafer. The use of a whip operation prior to rinsing with DI water significantly reduces develop defects.

42 Claims, 7 Drawing Sheets

1

DEVELOP PROCESSING METHOD OF A RESIST SURFACE ON A SUBSTRATE FOR REDUCED PROCESSING TIME AND REDUCED DEFECT DENSITY

This application is a divisional of U.S. application Ser. No. 09/945,565 filed on Aug. 30, 2001, now U.S. Pat. No. 6,559,072 which is incorporated herein by reference.

FIELD OF THE INVENTION

The invention relates to the fabrication of semiconductor devices, such as dynamic random access memory devices, and more particularly to lithographic processes such as resist patterning and developing.

BACKGROUND OF THE INVENTION

Integrated circuits (IC's) are typically fabricated from a wafer of semiconductor material, such as silicon. The silicon wafer goes through numerous processing steps in order to manufacture the final IC. A common cycle that wafers go through during manufacture is called photolithography. A basic photolithography cycle flow diagram, including some important process steps is shown in FIG. 1.

To start the cycle, the wafer is first coated with a photoresist which is a photosensitive material, as indicated in step 110. Optical pattern transfer tools are used to produce an optical pattern on photoresist which is generally baked subsequent to its deposition on a semiconductor substrate structure. A form of radiation, such as ultraviolet (UV) light, is directed at the optical pattern transfer tool. Transparent portions of the optical pattern transfer tool transmit the light to selected portions of the photoresist while opaque portions of the optical pattern transfer tool prohibit the light from reaching the remaining portions of the photoresist, as indicated in step 120.

When negative resist is used, photoresist not exposed to radiation is removed to expose portions of the substrate structure while the remaining resist protects unexposed portions of the substrate structure during subsequent processing steps. The opposite is true when positive resist is used. In this case the photo resist exposed to the radiation is removed. After exposure, the desired areas of the resist are selectively removed from the surface of the wafer, utilizing a "develop" step 130. The removal of selected areas of resist leaves behind both exposed areas of the wafer, and masked areas of the wafer.

During a develop step the portions to be removed are usually rendered soluble in a base solution and rinsed from the semiconductor substrate structure in a solvent such as de-ionized (DI) water. Remaining resist may then be hardened by re-baking to ensure adhesion of the resist to the semiconductor substrate structure.

The exposed areas of the wafer are then processed in one of several ways, including doping, etching and depositing layers of additional material as indicated in step 140. The masked areas are protected from the processing by the resist that remains on the wafer. After the exposed areas have been processed, the resist that remained on the wafer in masked areas is removed 150, and the cycle can be repeated. By combining several iterations of this cycle, along with other processing steps, the wafer is transformed into a number of IC chips.

This manufacturing process is extremely flexible, and any number of types of IC's can be fabricated using this technique. One example of IC's that can be made using this technique includes processor chips for information handling devices such as personal computers. Other IC's that can be made using this technique include memory circuits. Dynamic Random Access Memory (DRAM) circuits are typically manufactured using this technique as well as numerous other memory designs, including but not limited to, SDRAMs, SLDRAMs, RDRAMs, SRAMs, VRAMs and EEPROMs.

In the fabrication of IC's, as in any manufacturing process, the processing time to manufacture a device is critical to the manufacturing cost and supply of the product to buyers. Even when processing time is low, a high percentage of manufacturing defects can cut into manufacturing yield, which again negatively affects cost and supply to customers. Therefore, as manufacturing businesses progress, there is constant pressure to make products faster, and with fewer manufacturing defects.

A develop step from a prior method includes a "pre-wet" step to enhance thickness control and uniformity of the develop coating. The pre-wet step consists of coating the surface of the wafer with a de-ionized (DI) water solution before the develop coating is applied to the wafer. The DI solution in the prior art method reacts with a surfactant material in the develop material, and allows the develop coating to attain a more even puddle across the wafer. The prior art method further utilized a spinning wafer to distribute the DI water pre-wet solution and the develop material across the wafer.

However, the pre-wet step uses a considerable amount of process time to complete. It would be desirable to eliminate the pre-wet step while maintaining a controlled, uniform develop coating. It would further be desirable to design a develop process that reduces defects in the develop process, while at the same time, eliminating a costly time step such as the pre-wet step.

SUMMARY OF THE INVENTION

A method of develop processing of a resist surface of a substrate is shown. The method includes coating the resist surface with develop material. Also included is reacting the resist surface with the develop material in selected areas. Further, the method includes spinning the resist surface for a first period of time, and after the first period of time, continuing to spin the resist surface for a second period of time while simultaneously rinsing the resist surface with a solvent to remove the develop material and selected areas of the resist surface. The method may also include using a linear slit scan nozzle to deposit the develop material. It may further include using de-ionized water to rinse the substrate.

Another embodiment of the method includes coating the resist surface with develop material, without pre-wetting the resist surface. Also included is reacting the resist surface with the develop material in selected areas. Further, the other embodiment includes spinning the resist surface for a first period of time, and after the first period of time, continuing to spin the resist surface for a second period of time while simultaneously rinsing the resist surface with a solvent to remove remaining develop material and selected areas of the resist surface.

Positive or negative resist may be used with the inventive method. When negative resist is used, photoresist not exposed to radiation is removed to expose portions of the substrate structure while the remaining resist protects unexposed portions of the substrate structure during subsequent processing steps. The opposite is true when positive resist is used. In this case the photo resist exposed to the radiation is removed.

Various processing steps may be performed in conjunction with the novel develop processing method. Exposed areas of the substrate may be selectively doped, etched, or coated with an additional layer of material.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE PREFERRED EMBODIMENTS

Figure 1:
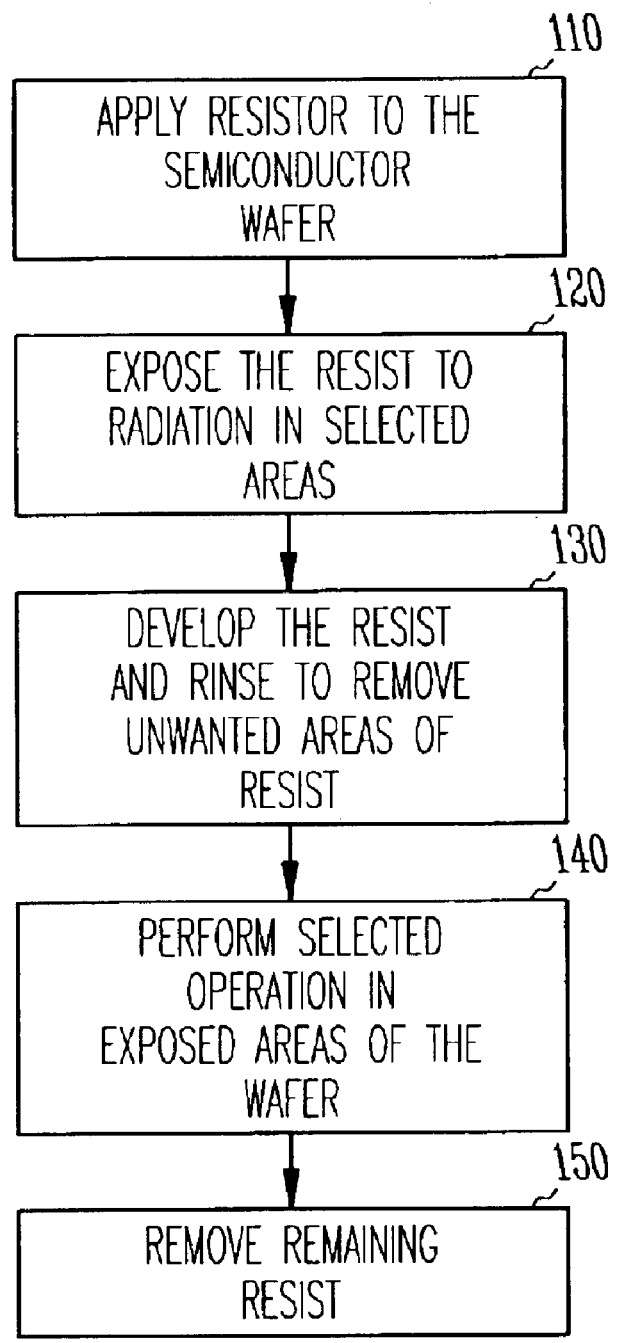
FIG. 1 shows a flow diagram for a basic photolithography technique according to prior art.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 2:
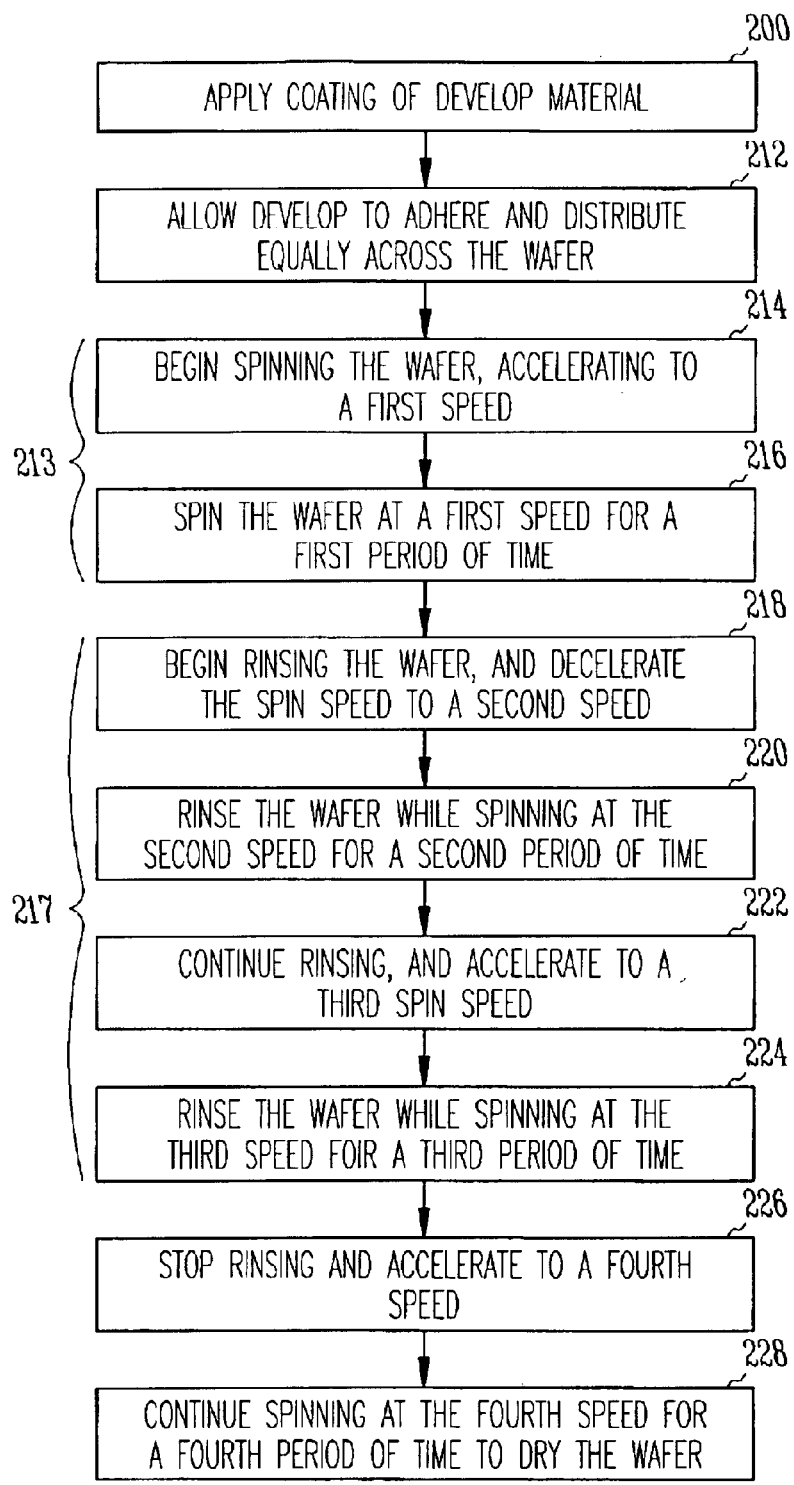
FIG. 2 shows a flow diagram of a develop process according to the invention.
Figure 3A:
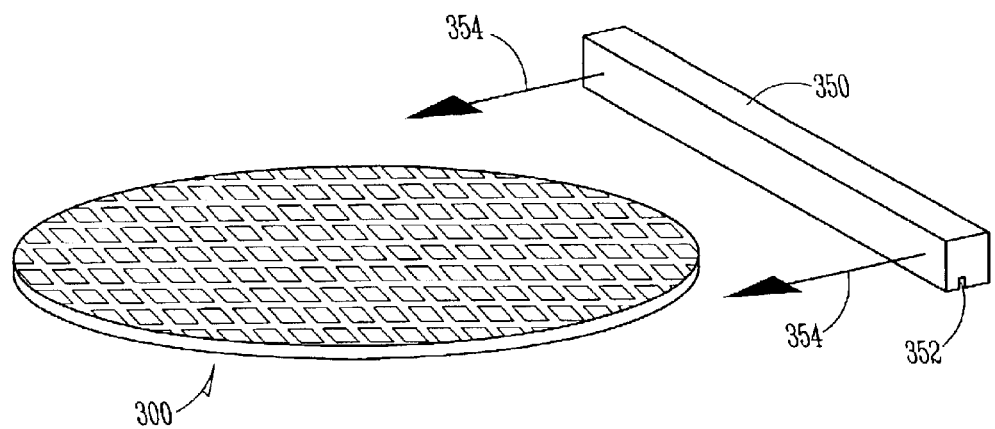
FIG. 3a shows a wafer and a first nozzle in a first stage of a develop process.

FIG. 2 shows a detailed flow diagram of the develop step 130 from FIG. 1. Selected steps from FIG. 2 are illustrated in FIGS. 3a–3e. The first step, as indicated in FIG. 2, is to deposit a layer or coating of develop material on the wafer. FIG. 3a shows a semiconductor wafer 300. In one embodiment, the semiconductor wafer 300 comprises silicon. Silicon wafers are typically single crystal silicon, however other forms of silicon such as silicon-on-insulator are possible as discussed above. Other semiconductor materials not comprising silicon are also possible. An example of a non-silicon semiconductor material would include gallium-arsenide.

The first step in the develop process of FIG. 2 is applying a coating of develop material as indicated by step 200. FIG. 3a illustrates a first nozzle 350 used to apply develop material. The first nozzle 350 is shown in a scanning start location. The first nozzle in one embodiment includes a linear slit 352 which distributes the develop material. The linear slit allows the first nozzle 350 to evenly distribute the develop material without the use of a DI pre-wet step as used in the prior art.

While the slit 352 in this embodiment is linear, utilizing a straight line for the slit 352, other slit configurations are possible such as arcs or other complex shapes. The first nozzle 350 in this embodiment is scanned across the wafer 300 in a linear motion as indicated by arrows 354. While a linear scan motion is described in this embodiment, other scan motions are possible within the scope of the invention such as arcuate scan motions or other complex scan motions. Although the shape of the slit 352 and the motion of the scan 354 may vary within the scope of the invention, an important aspect of the first nozzle 350 is that it allows the develop layer to be applied in a consistent and controlled layer without the use of a spinning wafer, or a wafer pre-wet step. In contrast, the DI pre-wet step from the prior art required process time for application of the DI water, and further required wafer acceleration and deceleration time, because the wafer needed to be spinning during application. In this embodiment, due to the shape of the slit, and the particular scan motion used, the first nozzle 350 may also be referred to as a linear slit scan nozzle.

Figure 3B:
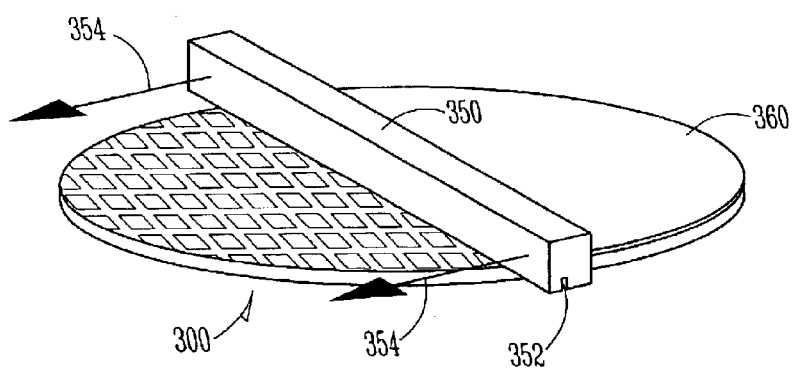
FIG. 3b shows the wafer and first nozzle in another stage of the develop process.

FIG. 3b shows the wafer 300 and the first nozzle 350 where the first nozzle is in the process of scanning the wafer 300 and depositing a layer of develop material 360. The linear slit scan nozzle design 350 is used because this design is capable of high precision deposition of the develop layer 360, without using a pre-wet step and without spinning the wafer 300. The resulting thickness and uniformity of the layer 360 is controlled by the machined dimensions of the first nozzle 350, and by surface tension of the resulting develop layer 360. The photolithography process requires tight control of the thickness and uniformity of the develop layer 360 in order to achieve high quality, low defect features in the resulting IC. The teachings of the present invention accord this tight control of thickness and uniformity.

Figure 3C:
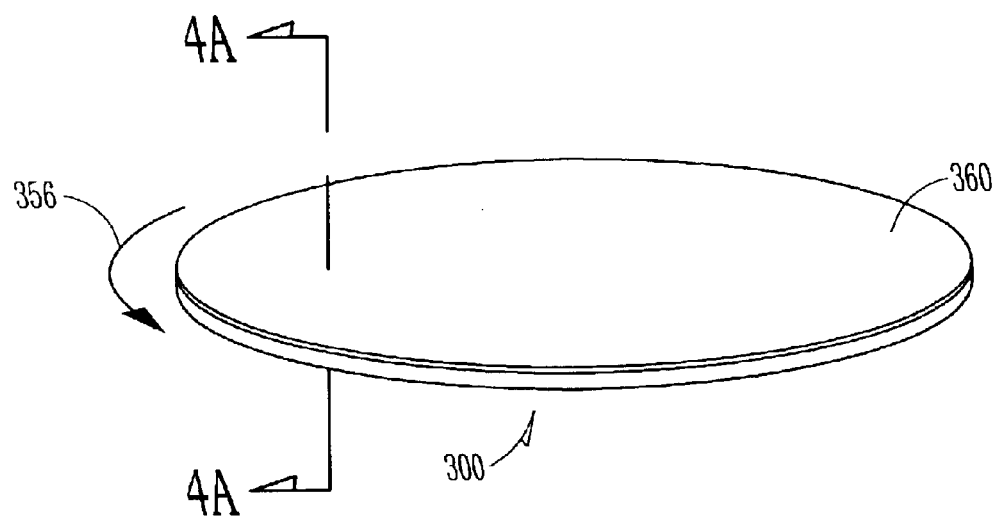
FIG. 3c shows the wafer in another stage of the develop process.

FIG. 3c shows the wafer 300 completely coated with the develop layer 360. The first nozzle 350 is moved to a location that is out of the way of the remaining process steps. The develop layer then dwells for a period of time, as indicated in step 212, to allow the develop material to chemically react with the resist layer. As previously discussed, in a negative resist process, the areas not exposed to radiation from step 120 of FIG. 1 are weakened. In a positive resist process, the areas exposed to radiation from step 120 of FIG. 1 are weakened. The dwell period also allows the develop layer to obtain its equilibrium thickness using surface tension. In one embodiment of the invention, the total dwell time is thirty seconds. However, in other embodiments, different dwell times are contemplated as will be understood by one skilled in the art.

After the develop layer 360 has been given sufficient dwell time, the wafer 300 is accelerated in a "whip" operation 213. The whip operation 213 includes a whip acceleration step 214 as shown on the flow chart in FIG. 2. The whip acceleration step 214 is performed before any rinsing of the wafer 300 is performed. In one embodiment of the invention, the whip acceleration step 214 is performed directly after the dwell step 212. In one embodiment of the invention, the wafer 300 is accelerated to a first speed over approximately 0.5 seconds of time. Arrow 356 of FIG. 3c shows the spinning of the wafer 300 as performed after the dwell step 212. In one embodiment, the first speed is approximately 2500 revolutions per minute (RPM). Although specific accelerations, speeds and times are detailed above, other accelerations, speeds and times may be used within the scope of the invention, provided the whip step 214 is performed before the rinse operation 217.

In another embodiment of the invention, the whip operation 213 includes both a whip acceleration step 214 and a constant speed step 216. In one embodiment of the invention, the wafer 300 is accelerated to a first constant speed over approximately 0.5 seconds of time. In one embodiment, the constant first speed is approximately 2500 RPM. The constant first speed is maintained for a period of approximately 1.0 seconds for a total whip time, including acceleration, of approximately 1.5 seconds. Although specific accelerations, speeds and times are detailed above, other accelerations, speeds and times may be used within the scope of the invention, provided the whip steps 214 and 216 of the whip operation 213 are performed before the rinse operation 217.

Figure 3D:
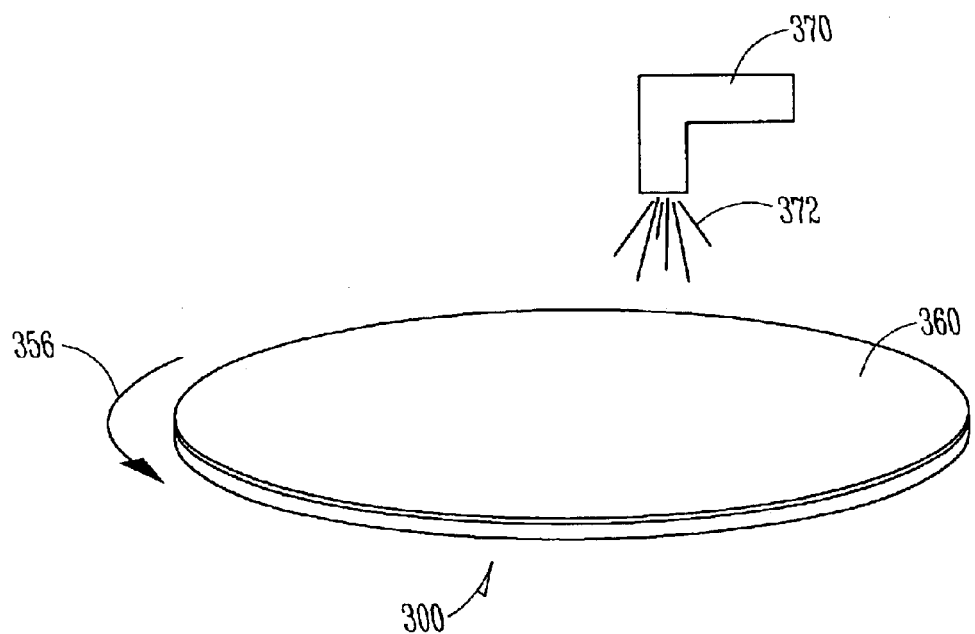
FIG. 3d shows the wafer and second nozzle in another stage of the develop process.

The rinse operation begins with step 218 from the flow chart in FIG. 2. In one embodiment of the invention, a solvent flow is introduced to the wafer to rinse the wafer of unwanted material. The rinse solvent in one embodiment includes DI water, and the DI water is introduced to both a top side of the wafer and a backside of the wafer. The unwanted material includes the develop layer 360, and parts of the resist that were selectively weakened by the develop material, due to the exposure to radiation. FIG. 3d also shows the wafer 300 with the develop layer 360 coating the top surface of the wafer 300. A second nozzle 370 introduces the DI water solvent 372 to the top surface of the wafer 300. The spinning motion 356 of the wafer distributes the DI water 372 across the surface of the wafer 300, and the spinning 356 aids in the removal of the unwanted material as discussed above.

In one embodiment, the second nozzle 370 begins introducing DI water to the wafer while the wafer is still spinning at the first speed of 2500 RPM. In one embodiment, the first speed is maintained for approximately 1.5 seconds, while the DI water is simultaneously introduced to the surface of the wafer. The rinse operation 217, in one embodiment, lasts approximately 17.5 seconds. While in this embodiment, the wafer speed is varied during the 17.5 seconds, variation of the speed is not necessary. Additionally, durations of time other than 17.5 seconds are acceptable under the scope of this invention, provided the whip operation 213 is performed before the rinse operation 217. Variations in the speed during the rinse operation 217 are discussed below.

After the 1.5 seconds of further spinning at the first speed while simultaneously introducing DI water to the surface of the wafer, the wafer speed may be changed to a second speed. In one embodiment, the second speed is lower than the first speed from the whip operation, and the wafer is decelerated over approximately 0.5 seconds. In one embodiment, the second speed is approximately 500 RPM. The second speed may also be held constant for a period of time, while the DI water remains flowing as indicated by step 220. In one embodiment, the second constant speed is approximately 500 RPM, and the second constant speed is held for a duration of approximately 10.0 seconds.

The rinse operation 217 may also include a third speed. The third speed in one embodiment is higher than the second speed, but lower than the first speed. In one embodiment, the wafer 300 is accelerated to the third speed over approximately 0.5 seconds, to a speed of approximately 700 RPM as indicated by step 222. The third speed may also be held constant for a period of time, while the DI water remains flowing as indicated by step 224. In one embodiment, the third constant speed is approximately 700 RPM, and the third constant speed is held for a duration of approximately 5.0 seconds.

Figure 3E:
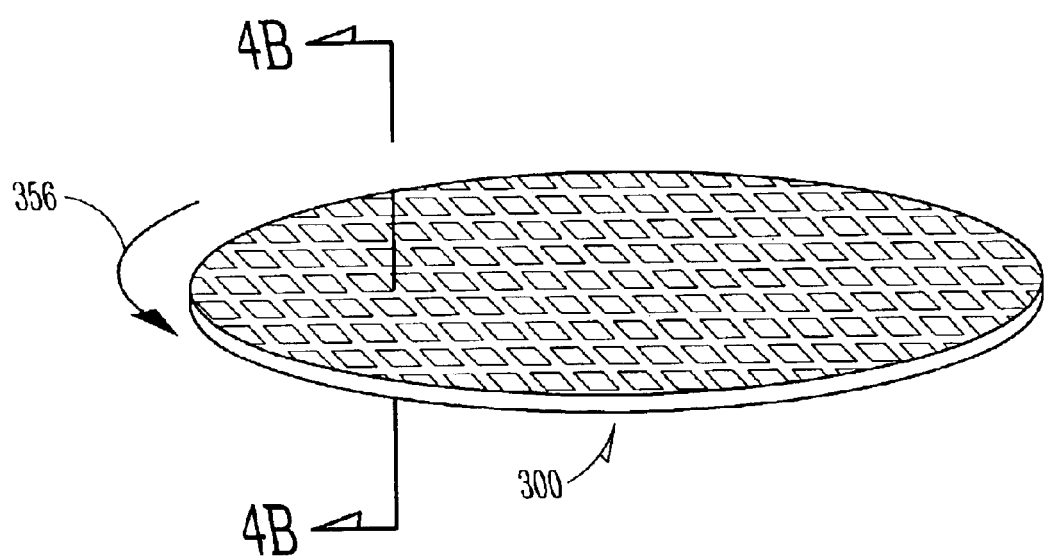
FIG. 3e shows the wafer in another stage of the develop process.

As indicated in step 226, the DI water rinse is turned off after the rinse operation 217. In one embodiment, the third constant speed of approximately 700 RPM is maintained for approximately 3.0 seconds after the DI water rinse is turned off. The wafer 300, in one embodiment, is then changed to a fourth speed to dry the wafer. The fourth speed in this embodiment is higher than the third speed. In one embodiment, the wafer 300 is accelerated to the fourth speed over approximately 1.0 seconds, to a speed of approximately 3000 RPM. The fourth speed may also be held constant for a period of time, as indicated by step 228. In one embodiment, the fourth constant speed is approximately 3000 RPM, and the fourth constant speed is held for a duration of approximately 10.0 seconds. FIG. 3e shows the wafer 300 spinning at the fourth speed as indicated by direction arrow 356. The develop layer 360 has been removed, along with other unwanted material, to expose the top surface of the wafer 300. Although unwanted material has been removed, certain portions of the resist material remain behind to allow processing of exposed portions of the wafer 300. The remaining portions of resist left behind are not shown in FIG. 3e due to their small scale. These portions are detailed in FIGS. 4a and 4b.

Figure 4A:
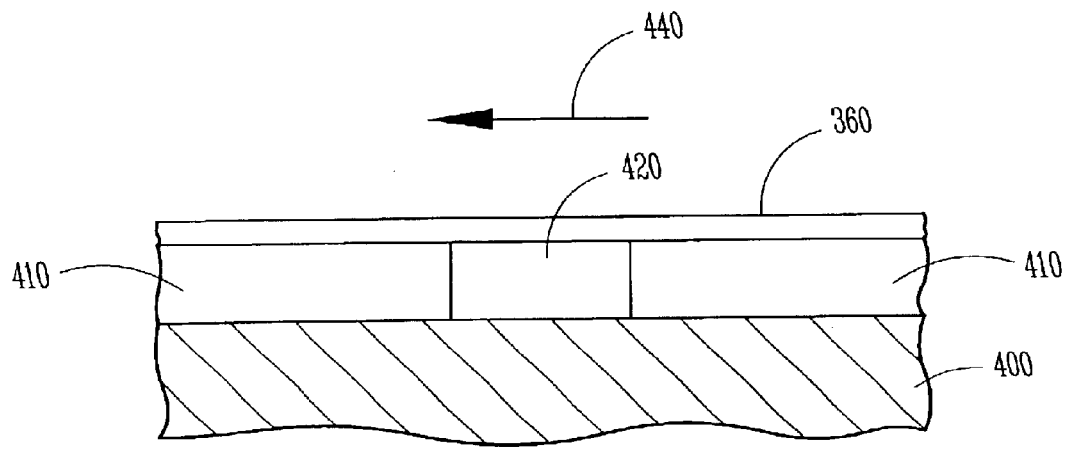
FIG. 4a shows a cross section of a wafer during a develop process.

FIG. 4a shows a cross section view of a wafer from FIG. 3c with a portion of a substrate 400 shown. First portions of resist 410 are shown, surrounding a second portion 420 of resist in the center of FIG. 4a. The develop layer 360 is shown covering the portions 410 and 420 of the resist. When the wafer 300 is spun as shown by arrow 356 in FIG. 3c, a centrifugal force is created in direction 440 as shown in FIG. 4a.

Figure 4B:
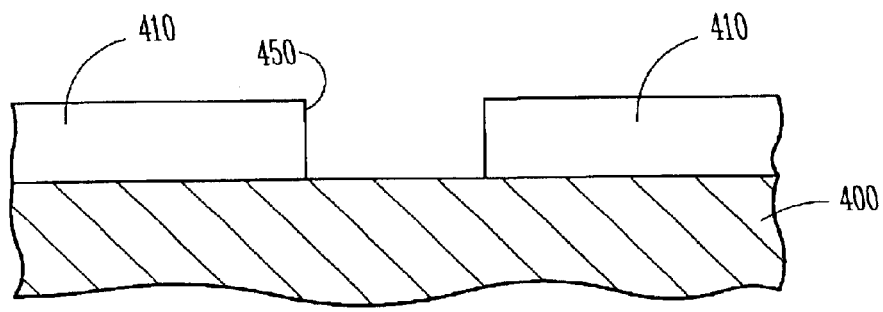
FIG. 4b shows a cross section of a wafer after a develop process.

FIG. 4b shows a cross section view of a wafer from FIG. 3e with a portion of the substrate 400 shown. The develop layer 360 has been removed, as has the unwanted second portion of resist 420. In the place of the second portion of resist 420 is a gap 450 that exposes a portion of the substrate 400. After the wafer has been dried in step 228 from FIG. 2, the remaining portions of resist may be baked to ensure adhesion to the substrate 400.

In addition to the cycle time saved by eliminating a pre-wet step, the novel method detailed above reduces defects in the photolithography process. Surface analysis shows that with the prior art process, incorporating the pre-wet step, there is an associated point defect rate of 12.2 defects per $cm^2$. Using the novel method detailed above, specifically utilizing the whip operation prior to rinsing with the DI water solution, the defect rate was reduced to 0.031 defects per $cm^2$.

Figure 4C:
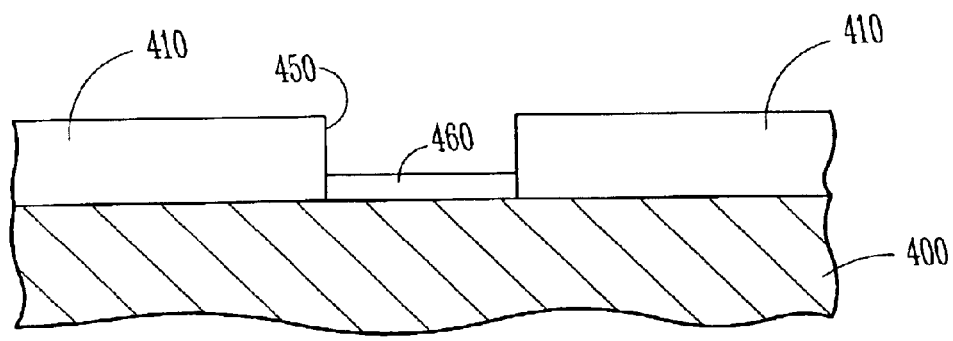
FIG. 4c shows a cross section of a wafer with a deposited layer.

After the develop process, the wafer is ready for any of a number of various further processing steps. FIG. 4c shows a cross section of a wafer similar to FIG. 4b. The substrate 400 has remaining portions of resist 410 adhered to its surface. In the gap 450, an additional layer of material 460 has been deposited on the substrate 400. Due to the presence of the remaining portions of resist 410, only the portion of the substrate 400 exposed by the gap 450 is coated by the additional layer 460. Some possible materials of the additional layer 460 include polysilicon, silicon nitride, silicon dioxide, refractory metals, etc.

Figure 4D:
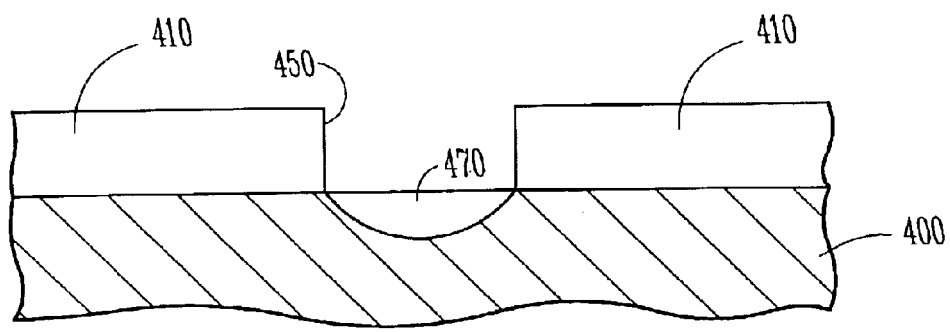
FIG. 4d shows a cross section of a wafer with a doped layer.

FIG. 4d shows the same cross section of a wafer as in FIG. 4c, with a different processing variation. The substrate 400 again has remaining portions of resist 410 adhered to its surface. In the gap 450, a doped region 470 has been created within the substrate 400. Due to the presence of the remaining portions of resist 410, only the portion of the substrate 400 exposed by the gap 450 is doped to form the doped region 470. Doping includes introduction of impurities to the semiconductor substrate 400 that change the properties of the doped region 470 to variations such as n-type or p-type. One possible doping operation includes ion implantation of impurity atoms into the substrate 400.

Figure 4E:
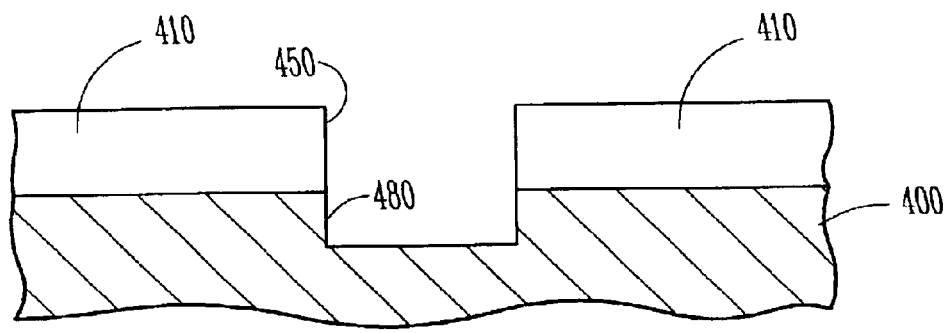
FIG. 4e shows a cross section of a wafer with an etched region.

FIG. 4e shows the same cross section of a wafer as in FIG. 4c, with a further processing variation. The substrate 400 again has remaining portions of resist 410 adhered to its surface. In the gap 450, an etched region 480 has been created within the substrate 400. Due to the presence of the remaining portions of resist 410, only the portion of the substrate 400 exposed by the gap 450 is etched to form the etched region 480.

While the examples of processing operations shown in FIGS. 4c–4e are typical of IC fabrication, these examples are not exhaustive. Other processing operations may also utilize the inventive develop method detailed herein without departing from the scope of the invention.

Conclusion

Thus has been shown a novel develop process for reduced cycle time and reduces defects in the develop process for semiconductor/IC fabrication. The use of a linear slit scan nozzle provides even distribution of a layer of develop material within an acceptable thickness and uniformity range such that a pre-wet step is not needed to spread the develop material evenly over the surface of a wafer. Further, the use of a whip operation prior to rinsing with DI water has proven effective to significantly reduce develop defects.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method of making a negative resist feature on a semiconductor surface, comprising:
   coating the semiconductor surface with resist material;
   exposing selected first areas of the resist material on the semiconductor surface to a radiation source, leaving second areas of the resist material unexposed;
   coating the resist material with develop material;
   reacting the resist material with the develop material in the first areas of the resist material;
   spinning the semiconductor surface for a first period of time after coating the resist surface and reacting the resist surface; and
   after the first period of time, continuing to spin the semiconductor surface for a second period of time while simultaneously rinsing the semiconductor surface with a solvent to remove the develop material and the second areas of the resist material, leaving the first areas of resist material behind on the semiconductor surface.

2. The method of claim 1, wherein coating the resist surface with develop material includes coating with a linear slit scan nozzle.

3. The method of claim 1, wherein spinning the resist surface includes spinning at 2500 RPM.

4. The method of claim 3, wherein spinning the resist surface further includes accelerating from 0 to 2500 RPM over a period of 0.5 seconds.

5. The method of claim 1, wherein spinning the resist surface for a first period of time includes spinning the resist surface for 1.5 seconds including acceleration time.

6. The method of claim 1, wherein continuing to spin the resist surface for a second period of time includes:
   continuing to spin at approximately 2500 RPM for approximately 1.5 seconds; and
   reducing to a lower RPM for the duration of the second period of time.

7. The method of claim 6, wherein reducing to a lower RPM for the duration of the second period of time includes:
   reducing to approximately 500 RPM over approximately 0.5 seconds of deceleration time; and
   holding at approximately 500 RPM for approximately 10 seconds.

8. A method of making a negative resist feature on a semiconductor surface, comprising:
   coating the semiconductor surface with resist material;
   exposing selected first areas of the resist material on the semiconductor surface to a radiation source, leaving second areas of the resist material unexposed;

coating the resist material with develop material, without pre-wetting the resist material surface;

reacting the resist material with the develop material in the first areas of the resist material;

spinning the semiconductor surface for a first period of time after coating the resist surface and reacting the resist surface; and after the first period of time, continuing to spin the semiconductor surface for a second period of time while simultaneously rinsing the semiconductor surface with a solvent to remove the develop material and the second areas of the resist material, leaving the first areas of resist material behind on the semiconductor surface.

9. The method of claim 8, wherein coating the resist surface with develop material includes coating with a linear slit scan nozzle.

10. The method of claim 8, wherein spinning the resist surface includes spinning at 2500 RPM.

11. The method of claim 10, wherein spinning the resist surface further includes accelerating from 0 to 2500 RPM over a period of 0.5 seconds.

12. The method of claim 8, wherein spinning the resist surface for a first period of time includes spinning the resist surface for 1.5 seconds including acceleration time.

13. The method of claim 8, wherein continuing to spin the resist surface for a second period of time includes:

continuing to spin at approximately 2500 RPM for approximately 1.5 seconds; and reducing to a lower RPM for the duration of the second period of time.

14. The method of claim 13, wherein reducing to a lower RPM for the duration of the second period of time includes:

reducing to approximately 500 RPM over approximately 0.5 seconds of deceleration time; and holding at approximately 500 RPM for approximately 10 seconds.

15. A method of doping a selected region of a semiconductor wafer, comprising:

coating a surface of the semiconductor wafer with resist material;

exposing first areas of the resist material on the semiconductor surface to a radiation source, leaving second areas of the resist material unexposed;

coating the resist material with develop material;

reacting the resist material with the develop material in the first areas of the resist material;

spinning the semiconductor wafer for a first period of time after coating the resist surface and reacting the resist surface;

after the first period of time, continuing to spin the semiconductor wafer for a second period of time while simultaneously rinsing the surface with a solvent to remove the develop material and selected areas of the resist material; and introducing a dopant species to the semiconductor wafer in areas of the semiconductor wafer that are exposed by the selected areas of resist that are removed.

16. The method of claim 15, wherein coating the resist surface with develop material includes coating with a linear slit scan nozzle.

17. The method of claim 15, wherein spinning the resist surface includes spinning at 2500 RPM.

18. The method of claim 17, wherein spinning the resist surface further includes accelerating from 0 to 2500 RPM over a period of 0.5 seconds.

19. The method of claim 15, wherein spinning the resist surface for a first period of time includes spinning the resist surface for 1.5 seconds including acceleration time.

20. The method of claim 15, wherein continuing to spin the resist surface for a second period of time includes:

continuing to spin at approximately 2500 RPM for approximately 1.5 seconds; and reducing to a lower RPM for the duration of the second period of time.

21. The method of claim 20, wherein reducing to a lower RPM for the duration of the second period of time includes:

reducing to approximately 500 RPM over approximately 0.5 seconds of deceleration time; and holding at approximately 500 RPM for approximately 10 seconds.

22. A method of doping a selected region of a semiconductor wafer, comprising:

coating a surface of the semiconductor wafer with resist material;

exposing first areas of the resist material on the semiconductor surface to a radiation source, leaving second areas of the resist material unexposed;

coating the resist material with develop material, without pre-wetting the resist material surface;

reacting the resist material with the develop material in the first areas of the resist material;

spinning the semiconductor wafer for a first period of time after coating the resist surface and reacting the resist surface;

after the first period of time, continuing to spin the semiconductor wafer for a second period of time while simultaneously rinsing the surface with a solvent to remove the develop material and selected areas of the resist material; and introducing a dopant species to the semiconductor wafer in areas of the semiconductor wafer that are exposed by the selected areas of resist that are removed.

23. The method of claim 22, wherein coating the resist surface with develop material includes coating with a linear slit scan nozzle.

24. The method of claim 22, wherein spinning the resist surface includes spinning at 2500 RPM.

25. The method of claim 24, wherein spinning the resist surface further includes accelerating from 0 to 2500 RPM over a period of 0.5 seconds.

26. The method of claim 22, wherein spinning the resist surface for a first period of time includes spinning the resist surface for 1.5 seconds including acceleration time.

27. The method of claim 22, wherein continuing to spin the resist surface for a second period of time includes:

continuing to spin at approximately 2500 RPM for approximately 1.5 seconds; and reducing to a lower RPM for the duration of the second period of time.

28. The method of claim 27, wherein reducing to a lower RPM for the duration of the second period of time includes:

reducing to approximately 500 RPM over approximately 0.5 seconds of deceleration time; and holding at approximately 500 RPM for approximately 10 seconds.

29. A method of etching a selected region of a semiconductor wafer, comprising:

coating a surface of the semiconductor wafer with resist material;

exposing first areas of the resist material on the semiconductor surface to a radiation source, leaving second areas of the resist material unexposed;

coating the resist material with develop material;

reacting the resist material with the develop material in the first areas of the resist material;

spinning the semiconductor wafer for a first period of time after coating the resist surface and reacting the resist surface;

after the first period of time, continuing to spin the semiconductor wafer for a second period of time while simultaneously rinsing the surface with a solvent to remove the develop material and selected areas of the resist material; and etching the semiconductor wafer in areas of the semiconductor wafer that are exposed by the selected areas of resist that are removed.

30. The method of claim 29, wherein coating the resist surface with develop material includes coating with a linear slit scan nozzle.

31. The method of claim 29, wherein spinning the resist surface includes spinning at 2500 RPM.

32. The method of claim 31, wherein spinning the resist surface further includes accelerating from 0 to 2500 RPM over a period of 0.5 seconds.

33. The method of claim 29, wherein spinning the resist surface for a first period of time includes spinning the resist surface for 1.5 seconds including acceleration time.

34. The method of claim 29, wherein continuing to spin the resist surface for a second period of time includes:

continuing to spin at approximately 2500 RPM for approximately 1.5 seconds; and reducing to a lower RPM for the duration of the second period of time.

35. The method of claim 34, wherein reducing to a lower RPM for the duration of the second period of time includes:

reducing to approximately 500 RPM over approximately 0.5 seconds of deceleration time; and holding at approximately 500 RPM for approximately 10 seconds.

36. A method of etching a selected region of a semiconductor wafer, comprising:

coating a surface of the semiconductor wafer with resist material;

exposing first areas of the resist material on the semiconductor surface to a radiation source, leaving second areas of the resist material unexposed;

coating the resist material with develop material, without pre-wetting the resist material surface;

reacting the resist material with the develop material in the first areas of the resist material;

spinning the semiconductor wafer for a first period of time after coating the resist surface and reacting the resist surface;

after the first period of time, continuing to spin the semiconductor wafer for a second period of time while simultaneously rinsing the surface with a solvent to remove the develop material and selected areas of the resist material; and etching the semiconductor wafer in areas of the semiconductor wafer that are exposed by the selected areas of resist that are removed.

37. The method of claim 36, wherein coating the resist surface with develop material includes coating with a linear slit scan nozzle.

38. The method of claim 36, wherein spinning the resist surface includes spinning at 2500 RPM.

39. The method of claim 38, wherein spinning the resist surface further includes accelerating from 0 to 2500 RPM over a period of 0.5 seconds.

40. The method of claim 36, wherein spinning the resist surface for a first period of time includes spinning the resist surface for 1.5 seconds including acceleration time.

41. The method of claim 36, wherein continuing to spin the resist surface for a second period of time includes:

continuing to spin at approximately 2500 RPM for approximately 1.5 seconds; and reducing to a lower RPM for the duration of the second period of time.

42. The method of claim 41, wherein reducing to a lower RPM for the duration of the second period of time includes:

reducing to approximately 500 RPM over approximately 0.5 seconds of deceleration time; and holding at approximately 500 RPM for approximately 10 seconds.

* * * * *